United States Patent [19]

Wright et al.

[11] Patent Number: 5,041,761
[45] Date of Patent: Aug. 20, 1991

[54] MAGNETIC AUTOMOTIVE LAMP CURRENT SENSOR

[75] Inventors: James A. Wright, Dearborn Heights; Nathaniel Webb, Southfield, both of Mich.; Harry F. Olmstead, Vero Beach, Fla.; Frank Buccinna, Dearborn, Mich.

[73] Assignee: United Technologies Automotive, Inc., Dearborn, Mich.

[21] Appl. No.: 582,272

[22] Filed: Sep. 14, 1990

[51] Int. Cl.⁵ .................. G08B 21/00; B60Q 1/02
[52] U.S. Cl. ................................. 315/129; 315/82; 340/641; 340/643
[58] Field of Search .................. 315/129, 83, 83, 130, 315/131, 132; 340/641, 643, 642; 324/219, 228, 260, 263

[56] References Cited

U.S. PATENT DOCUMENTS

| | | | |
|---|---|---|---|
| 3,956,733 | 5/1976 | Sakurai | 340/643 X |
| 3,995,262 | 11/1976 | France et al. | 340/643 X |
| 4,667,187 | 5/1987 | Volk et al. | 340/641 |

Primary Examiner—Eugene R. LaRoche
Assistant Examiner—Ali Neyzari

[57] ABSTRACT

A magnetic automotive lamp current sensor has a coil 12 connected in series with an automotive lamp 14 (FIG. 2). The coil is mounted on a core 15 having a channel 16 through which the turns of the coil pass an has an opening 18 in which a magnetic flux sensor 20 is inserted. Whenever the lamp is powered and functioning, a current flows through the coil inducing a magnetic field in the core which concentrates in the opening. The flux sensor detects the magnetic field and generates an output which is regulated by a transistor 50 to drive an automotive circuit 53 that monitors the operation of the lamp.

3 Claims, 1 Drawing Sheet

MAGNETIC AUTOMOTIVE LAMP CURRENT SENSOR

TECHNICAL FIELD

This invention relates to current sensors, and more particularly to magnetic automotive lamp current sensors.

BACKGROUND ART

Detecting an automotive lamp outage with a current sensor is well known in the art. The current sensor generally comprises a low ohmic resistor in series with the lamp. The resistance value of the resistor limits the amount of heat dissipated and energy lost through the resistor. When the voltage drop across the resistor exceeds a threshold voltage level as compared by a voltage comparator, an output is generated which drives an automotive circuit that monitors the operation of the lamp. The comparator is required because the low voltage level obtained with the resistor is not sufficient to drive the automotive circuit. However, the resistor generates an excessive amount of heat when the lamp is powered and functioning. In addition the plurality of resistor type current sensors, required to detect outages in the many lamps of an automobile, are typically grouped on a circuit board. The cumulative heat build up from the resistor type current sensors on the circuit board results in unnecessary failures and energy losses.

A ferrite core with a coil and a Hall effect transducer has also been used as a method for sensing a flow of current. The coil is connected in series with a device, for example an automotive lamp, so that when power is applied to the device a current passes through the coil. The current in the coil, which is wrapped around the ferrite core, generates a magnetic field which is transferred through the ferrite core to the Hall effect transducer, which senses magnetic flux above a threshold level and produces an electrical output. However, ferrite cores generally consist of nonmetallic, ceramic-like compounds and are restricted to certain shapes and sizes. The ferrite core of a size adequate for sensing an automotive lamp current occupies a prohibitive amount of circuit board space. Also, the ferrite core is easily fractured and requires additional hardware for mounting on a circuit board. Although the ferrite core type sensor dissipate less heat than the resistor type current senors, the ferrite core type sensor is not suitable to be employed in sensing the operation of an automotive lamp.

Materials with a high magnetic permeability have long been used as a core for a coil. However, a magnetic field generated by a coil having such a core has not been previously configured so as to be suitable for employment in sensing the operation of an automotive lamp.

DISCLOSURE OF INVENTION

Objects of the present invention include provision of a magnetic automotive lamp current sensor which senses an automotive lamp current to detect an automotive lamp outage, which is suitable for mounting in a small area on a circuit board, and which dissipates a minimal amount of heat.

According to the present invention, a magnetic automotive lamp current sensor is formed by a coil connected in series with an automotive lamp, the coil being disposed on a core, the core having a channel through which the turns of the coil pass and having an opening in which a magnetic flux sensor is inserted, to detect a magnetic field and generate an output whenever a current flows through the coil.

The present invention provides a magnetic automotive lamp current sensor for detecting the lamp current, which employs a magnetic field and dissipates far less heat than a resistor type current sensor. Further, the present invention easily mounts in a small area on a circuit board employed for sensing the operation of the lamp. This invention eliminates the need for the voltage comparators required with the resistor type current sensors. The invention is also less expensive than the alternative sensing devices. Thus the magnetic automotive lamp current sensor is an efficient and inexpensive method of detecting the automotive lamp current to, in turn, indicate an automotive lamp outage.

The foregoing and other objects, features and advantages of the present invention will become more apparent in light of the following detailed description of an embodiment of the present invention as shown in the accompanying drawing.

BEST MODE FOR CARRYING OUT THE INVENTION

Figure 1:
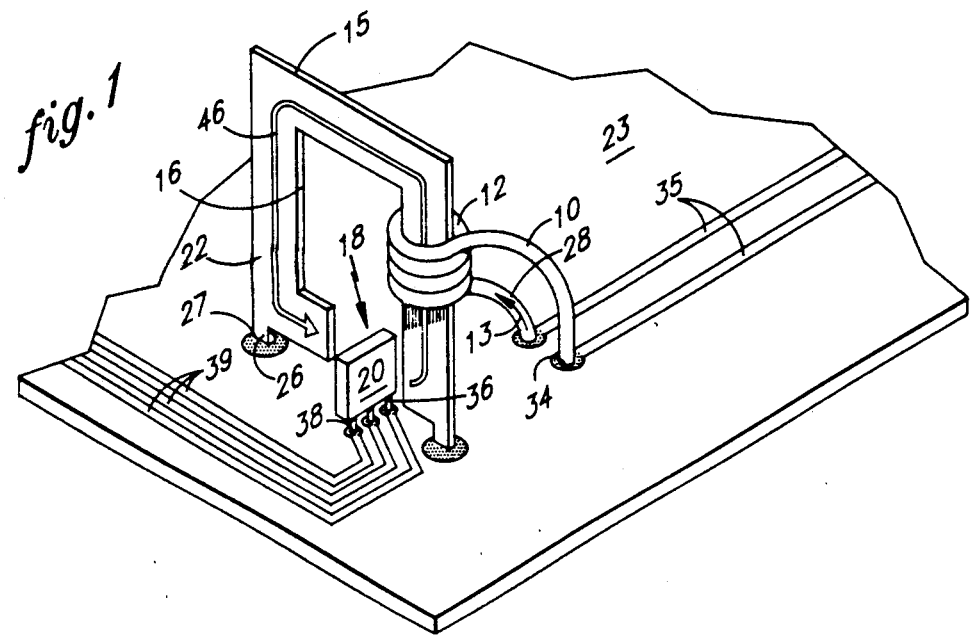
FIG. 1 is a perspective view of an embodiment of a magnetic current sensor of the present invention mounted on a circuit board.

Referring now to FIG. 1, an embodiment of the present invention comprises a known type magnet wire 10 with a plurality of turns forming a coil 12, which is coated with a varnish. The number of turns in the coil 12 and the gauge of the magnet wire 10 are dependant on the magnitude of a current illustrated by an arrow 13, and designated "I". The current drawn by an automotive lamp 14 (FIG. 2) is in the range of one half amp DC to four and one half amp DC. The coil is mounted on a rectangular core 15 having a channel 16 through which the turns of the coil pass, and an opening 18 in which a magnetic flux sensor 20 is inserted. The magnetic flux sensor 20 comprises a Hall effect transducer of a type known in the art. The core 15 is comprised of SAE 1010 steel and is partially coated with an epoxy paint 22 in an area where the coil may be located.

The core may be retained on a circuit board 23 by soldering a pair of tabs 26 to a pair of plated holes 27. The coil leads 28 may be soldered to another pair of holes 34, each having a current trace 35. The sensor 20 may be mounted on the circuit board by soldering the sensor leads 36 to a plurality of holes 38, each having a current trace 39.

Figure 2:
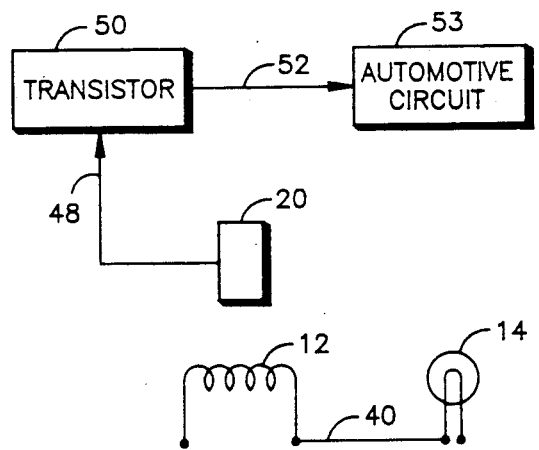
FIG. 2 is a simplified, schematic block diagram of the principal portions of a circuit employed in detecting an automotive lamp current in accordance with the present invention.

Referring also to FIG. 2, the coil 12 is connected in series with the lamp 14 by a line 40. When the lamp is powered and functioning, the current passes through the coil, which sets up a magnetic field represented by an arrow 46. The magnetic field is transferred through the core 15 and concentrates in the opening 18 for detection by the flux sensor 20, which generates an output when the field exceeds a threshold level. The concentration of the field is increased when the size of the opening is reduced. However, the amount the opening may be reduced is limited by the size of the sensor. The sensor output on a line 48 drives an open collector transistor 50, powered by a separate source (not shown), to regulate the output. The transistor is connected by a line 52 to an automotive circuit 53 that monitors the operation of the lamp 14. When the lamp is off or not functioning the sensor 20 does not produce the output and the transistor does not turn on.

The foregoing description is merely exemplary and it should be understood that although the invention is described with the core 15 (FIG. 1) having a rectangular shape and being made of SAE 1010 steel, other materials having a high magnetic permeability with different shapes may be employed. Although the magnetic flux sensor 20 is described implementing a Hall effect transducer, other devices capable of converting magnetic flux to an electrical output may be employed. Although the open collector transistor 50 (FIG. 2) is described for regulating the output of the magnetic flux sensor 20 (FIG. 1), other devices capable of regulating the output may be employed.

It suffice for the broadest scope of the present invention that a current flow through the coil 12 generates a magnetic field which is transferred through the core 15 activating the magnetic flux sensor 20 to, in turn sense the operation of the automotive lamp. Similarly, although the invention has been shown and described with respect to an exemplary embodiment thereof, it should be understood by those skilled in the art that the foregoing and various other changes, omissions and additions in the form and detail thereof may be made therein thereto, without departing from the spirit and scope of the invention.

We claim:

1. A magnetic automotive lamp current sensor for sensing the operation of an automotive lamp which may be mounted on a circuit board, comprising:

a coil connected in series with the automotive lamp, said lamp coil having a plurality of turns of wire for inducing a magnetic field when a current passes through said turns of wire;

a core of a material having a magnetic permeability for transferring said magnetic field, said core having a channel through which said turns of wire pass, so that said magnetic field is induced in said core in response to said current flow in said wire, and having an opening leading to said channel in which said magnetic field is concentrated, said core comprises a generally rectangular element, said channel being of a generally rectangular shape passing through the center of said generally rectangular element, and said opening being of a generally rectangular shape passing through said generally rectangular element to said channel; and magnetic flux sensor means, disposed in said opening, for detecting said magnetic field induced in said core, and for generating an electrical output when said magnetic field exceeds a threshold level.

2. A magnetic automotive lamp current sensor according to claim 1, wherein said core further comprises a pair of tabs protruding from the edges of said rectangular element on each side of said opening for soldering to the circuit board, so that said core is mounted on the circuit board.

3. A method for detecting an electrical current through an automotive lamp, which comprises:

connecting the lamp in series with a coil having plurality of turns of wire for inducing a magnetic field when the current passes through said turns of wire;

transferring said magnetic field through a core of a material having magnetic permeability, said core having a channel through which said turns of wire pass, so that said magnetic field is induced in said core in response to the current flow in said wire, and having an opening leading to said channel in which the magnetic field is concentrated, said core comprises a generally rectangular element, said channel being of a generally rectangular shape passing through the center of said generally rectangular element, and said opening being of a generally rectangular shape passing through said generally rectangular element to said channel;

sensing said magnetic field concentrated in said opening; and generating an electrical output when said magnetic field exceeds a threshold level.

* * * * *